(12) United States Patent
Christoph

(10) Patent No.: US 9,148,126 B2
(45) Date of Patent: Sep. 29, 2015

(54) SUB-BAND SIGNAL PROCESSING

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1120 days.

(21) Appl. No.: 12/633,425

(22) Filed: Dec. 8, 2009

(65) Prior Publication Data

US 2010/0146026 A1 Jun. 10, 2010

(30) Foreign Application Priority Data

Dec. 8, 2008 (EP) ..................................... 08021280

(51) Int. Cl.
*G06F 17/17* (2006.01)
*H03H 17/02* (2006.01)
*H03H 17/06* (2006.01)

(52) U.S. Cl.
CPC ............ *H03H 17/0272* (2013.01); *G06F 17/17* (2013.01); *H03H 17/0657* (2013.01); *H03H 17/0664* (2013.01)

(58) Field of Classification Search
None
See application file for complete search history.

(56) References Cited

U.S. PATENT DOCUMENTS

| 5,910,904 | A | 6/1999 | Uramoto | |
|---|---|---|---|---|
| 2004/0066803 | A1* | 4/2004 | Talwalkar et al. | 370/535 |
| 2005/0143973 | A1* | 6/2005 | Taniguchi et al. | 704/200.1 |
| 2008/0273718 | A1 | 11/2008 | Ohkuri et al. | |

OTHER PUBLICATIONS

Zolzer et al. "Digital Audio Signal Processing", B.G. Teubner Stuttgart, pp. 283-285, 1997.
Verification of Translation.
Schonle et al., "Parametric approximation of room impulse responses based on wavelet decomposition", Applications of Signal Processing to Audio and Acoustics, 1993. Final Program and Paper Summaries, 1993 IEEE Workshop on New Paltz, NY, USA, pp. 68-71.
Lyons, R.G., "Understanding Digital Signal Processing", Addision Wesley Longman, Inc. 1997, XP002530604, URL: http://www.dspguru.com/info.terms.filtterm/index2.html, p. 1, Lines 1-11.
Filege et al. "Multi-Complementary Filter Bank", Acoustics, Speech, and Signal Processing, 1993. IEEE International Conference on Apr. 1993, vol. 3, p. III-193-III-196.
Japanese Office Action for JP 2009-238785 dated Aug. 22, 2013.

* cited by examiner

*Primary Examiner* — Henry Tsai
*Assistant Examiner* — Aurangzeb Hassan
(74) *Attorney, Agent, or Firm* — O'Shea Getz P.C.

(57) ABSTRACT

An apparatus for sub-band processing of an input signal includes an analysis filter bank, signal processors and a synthesis filter bank. The analysis filter bank includes first and second signal branches for decomposing the input signal into two sub-band signals. The first signal branch includes a decimation filter connected upstream of a down-sampling unit and a basis filter. The second branch includes an all-pass filter and a subtractor that is connected downstream of the all-pass filter and the basis filter in the first signal branch via an up-sampling unit and a subsequent interpolation filter. At least one of the decimation filter and the interpolation filter is an infinite impulse response filter, and the all-pass filter has a phase response that compensates for a phase response of at least one of the decimation filter and the interpolation filter.

27 Claims, 4 Drawing Sheets

SUB-BAND SIGNAL PROCESSING

CLAIM OF PRIORITY

This patent application claims priority from European Patent Application No. 08 021 280.6 filed on Dec. 8, 2008, which is hereby incorporated by reference in its entirety.

FIELD OF TECHNOLOGY

This invention relates to signal processing and, in particular, to sub-band audio signal processing.

RELATED ART

Signal sub-band processing is widely used in audio signal processing systems. In such systems, input signals are decomposed into at least two frequency bands and each frequency band is subsequently processed. For example, an analysis filter bank decomposes the input signal into a predetermined number of frequency bands and provides a plurality of sub-band signals which are then processed. These processed sub-band signals are then recomposed into a processed signal via a synthesis filter bank.

Disadvantageously, such analysis and synthesis filters can introduce significant delays into the processing of the signal sub-bands. Typically, filters employed in the analysis and synthesis filter banks are linear phase filters (i.e., finite impulse response filters ("FIR")). This is a result of employing in known combinations either (i) a linear phase analysis filter and a linear phase synthesis filter (i.e., finite impulse response filters), or (ii) a minimum phase analysis filter and a maximum phase synthesis filter, or vice versa. However, regardless of the filter types, linear phase or minimum/maximum phase filters can have an unsatisfactory computational efficiency.

SUMMARY OF THE INVENTION

According to one aspect of the invention, an apparatus for sub-band processing of an audio input signal includes an analysis filter bank, signal processors and a synthesis filter bank. The analysis filter bank includes first and second parallel signal branches for decomposing the input signal into two sub-band signals. The first signal branch includes a decimation filter connected upstream of a down-sampling unit and a basis filter. The second branch includes an all-pass filter and a subtractor that is connected downstream of the all-pass filter and the basis filter in the first signal branch via an up-sampling unit and a subsequent interpolation filter. At least one of the decimation filter and the interpolation filter is an infinite impulse response filter, and the all-pass filter has a phase response that compensates for a phase response of at least one of the decimation filter and the interpolation filter.

According to another aspect of the invention, an apparatus for sub-band processing an audio input signal includes an analysis filter bank, first and second sub-band signal processors and a synthesis filter bank. The analysis filter bank includes first and second parallel signal branches for decomposing the input signal into two sub-band signals. The first signal branch includes a decimation filter connected upstream of a down-sampling unit and a basis filter. The second signal branch includes an all-pass filter and a subtractor that is connected downstream of the all-pass filter and the basis filter in the first signal branch via a first up-sampling unit and a first interpolation filter. The first and the second sub-band signal processors respectively receive the two sub-band signals from the analysis filter bank, and generate two processed sub-band signals. The synthesis filter bank includes an adder that receives the processed sub-band signal of the second branch and the processed sub-band signal of the first branch via a second up-sampling unit and a subsequent second interpolation filter, and the synthesis filter provides an output signal. At least one of the decimation filter and the first interpolation filter comprise an infinite impulse response filter. The all-pass filter has a phase response that compensates for a phase response of at least one of the decimation filter and the first interpolation filter.

According to another aspect of the invention, a method for sub-band processing of an input signal includes decomposing the input signal into two sub-band signals for establishing two sub-bands by decimation filtering, down-sampling and basis-filtering in a first signal branch, and all-pass filtering and subtracting an up-sampled and interpolation-filtered signal of the first signal branch from an all-pass filtered input signal in a second signal branch; processing the two sub-band signals from the first and the second signal branches in the respective sub-bands and to generate two processed sub-band signals; and synthesizing an output signal by up-sampling and interpolating the processed sub-band signal of the first branch, and adding the processed sub-band signal of the second signal branch and the up-sampled and interpolated processed sub-band signal of the first signal branch. At least one of the decimation filtering and the first interpolation filtering has an infinite impulse response. An all-pass filtering phase response compensates for a phase response of at least one of the decimation filtering and the first interpolation filtering.

According to another aspect of the invention, an apparatus for sub-band processing an input audio signal includes an analysis filter bank, a processor and a synthesis filter bank. The analysis filter bank receives the input audio signal and includes first and second parallel signal branches that respectively provide first and second sub-band signals. The first signal branch includes a decimation filter connected upstream of a down-sampling unit and a basis filter. The second signal branch includes an all-pass filter connected upstream of a subtractor that receives the first sub-band signal through a first up-sampling unit and a first interpolation filter. The processor processes the first and the second sub-band signals to generate respective first and second processed sub-band signals. The synthesis filter bank includes an adder that receives the first processed sub-band signal through a second up-sampling unit and a second interpolation filter and the second processed sub-band signal, and the synthesis filter bank provides an output signal. At least one of the decimation filter and the first interpolation filter include an infinite impulse response filter. The all-pass filter has a phase response that compensates for a phase response from at least one of the decimation filter and the first interpolation filter.

According to still another aspect of the invention, a method for sub-band processing an input audio signal in a vehicle includes decomposing the input audio signal into first and second sub-band signals by decimation filtering, down-sampling and basis-filtering a first signal in a first signal branch to provide the first sub-band signal, up-sampling and interpolating the first sub-band signal, all-pass filtering a second signal in a second signal branch, and subtracting the up-sampled and interpolated first sub-band signal from the all-pass filtered second signals to provide a second sub-band signal; generating first and second processed sub-band signals from the first and the second sub-band signals via one or more processors; and synthesizing the first and the second processed sub-band signals in a synthesis filter bank by up-sampling and interpolating the first processed sub-band signal, and adding the up-sampled and interpolated first processed sub-band signal to the second processed sub-band signal to provide an output signal. At least one of the step of decimation filtering and the first step of interpolation filtering infinite impulse response filtering. An all-pass filtering phase response compensates for a phase response of at least one of the step of decimation filtering and the first step of interpolation filtering.

DESCRIPTION OF THE DRAWINGS

The invention can be better understood with reference to the following drawings and description. The components in the figures are not necessarily to scale, instead emphasis being placed upon illustrating the principles of the invention. Moreover, like reference numerals designate corresponding parts. In the drawings.

DETAILED DESCRIPTION

Figure 1:
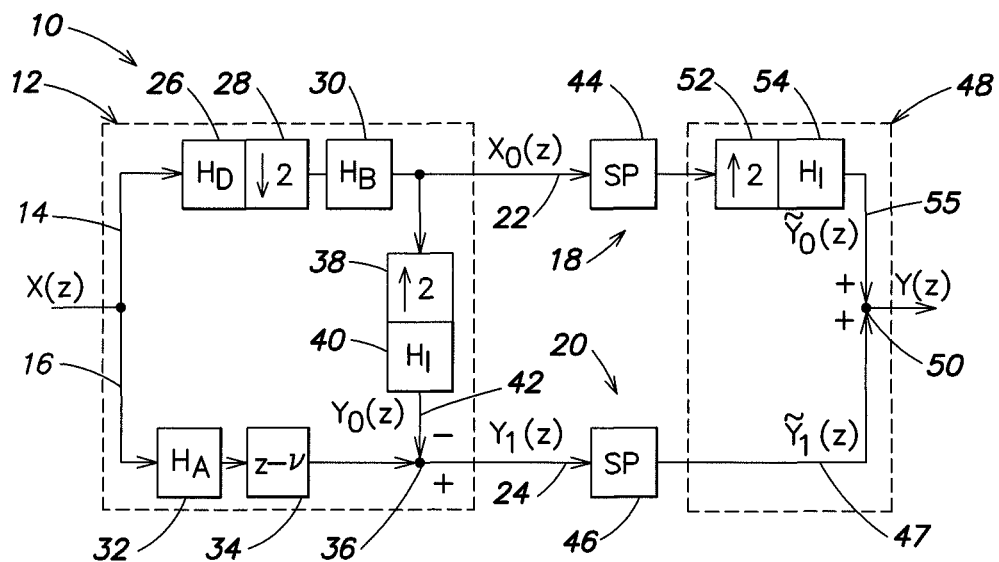
FIG. 1 illustrates one embodiment of a sub-band signal processing apparatus for parallel processing two sub-bands.

FIG. 1 illustrates one embodiment of an apparatus 10 for sub-band processing of an input audio signal X(z). The sub-band processing apparatus 10 includes an analysis filter bank 12 that receives the audio signal X(z) and has two signal branches 14, 16. The signal branches 14, 16 establish two sub-bands, a low-pass sub-band ("LP-SB") 18 and a high-pass sub-band ("HP-SB") 20, and decompose the audio signal X(z) into two respective sub-band signals $X_0(z)$ and $Y_1(z)$ on lines 22, 24, respectively. The first signal branch 14 includes a decimation filter 26 having a transfer function $H_D$, a subsequent down-sampling unit 28 for decreasing a sample rate of the audio signal X(z), for example, by two, and a subsequent basis filter 30 having a transfer function $H_B$. The second branch 16 includes an all-pass filter 32 having a transfer function $H_A$, a delay element 34 having a delay time $z^{-v}$, and a subtractor 36. A first up-sampling unit 38 receives the signal on the line 22 and provides an up-sampled signal to a first interpolation filter 40, which generates a signal $Y_0(z)$ on line 42. The difference unit 36 provides the signal $Y_1(z)$ on the line 24.

A first sub-band signal processor 44 processes the sub-band signal $X_0(z)$ on the line 22, and generates a first processed sub-band signal. A second sub-band signal processor 46 processes the sub-band signal $Y_1(z)$ on the line 24 and generates a second processed sub-band signal $\tilde{Y}_1(z)$ on line 47.

A synthesis filter bank 48 for synthesizing a processed audio signal Y(z) includes an adder 50, a second up-sampling unit 52, and a second interpolation filter 54. The first processed sub-band signal generated on the low-pass sub-band 18 is provided to the second interpolation filter 54 through the second up-sampling unit 52. The adder 50 receives: (i) a first processed sub-band signal $\tilde{Y}_0(z)$ on line 55, and (ii) the second processed sub-band signal $\tilde{Y}_1(z)$ on the line 47 (e.g., the second processed sub-band signal generated via the high-pass sub-band 20), and provides the processed audio signal Y(z).

The decimation filter 26 and the first and the second interpolation filters 40, 54 are configured as infinite impulse response ("IIR") filters having, for example, identical low-pass transfer functions. The all-pass filter 32 exhibits a recursive part of the cascaded decimation and first interpolation filters 26 and 40. Accordingly, the all-pass filter 32 has a phase response that compensates for the phase responses of the decimation filter 26 and the first interpolation filter 40.

In the present embodiment, the basis filter 30 is configured as a linear phase filter, such as a finite impulse response ("FIR") filter or a linear phase infinite impulse response filter. Linear phase defines a relatively constant delay for all frequency components between an output and an input. FIR filters are used where a strict linear phase is implemented. A linear phase filter is a filter whose phase response is a linear function of the frequency. In contrast, the decimation filter 26 and the first and the second interpolation filters 40 and 54 are configured as IIR minimum phase filters. A filter has "minimum phase" where both its transfer function and an inverse of its transfer function are stable and causal. In other words, both have their zeros and poles inside the unit circle.

Figure 2:
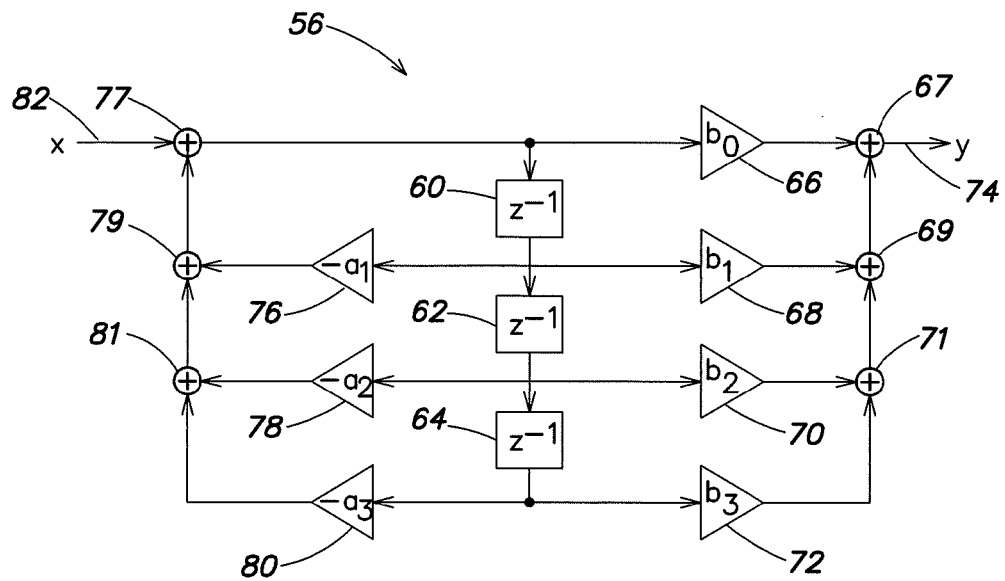
FIG. 2 illustrates one embodiment of a third order IIR filter of a direct form II, which may be included in the sub-band signal processing apparatus in FIG. 1.
Figure 3:
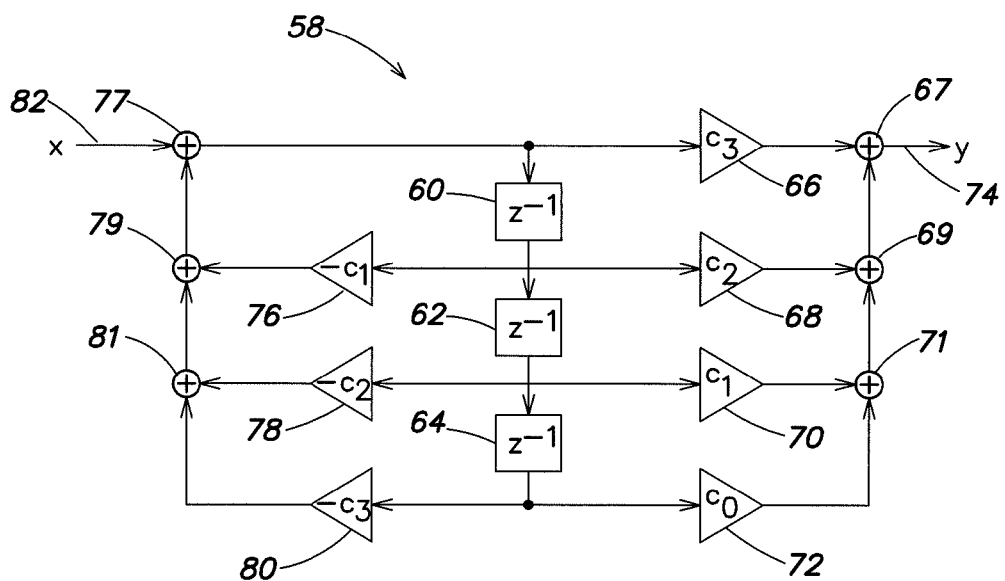
FIG. 3 illustrates one embodiment of a third order all-pass filter of a direct form II, which may be included in the sub-band signal processing apparatus in FIG. 1.

FIGS. 2 and 3 illustrate embodiments of a third ("3rd") order low-pass IIR filter 56 of a direct form II (FIG. 2) and a 3rd order all-pass filter 58 of a direct form II (FIG. 3) which can be employed in the sub-band processing apparatus 10 in FIG. 1. Referring to FIG. 2, the 3rd order low-pass filters 56 includes a delay line having three delay elements 60, 62, 64 connected in series with taps in between. An input of the delay line (e.g., an input of the delay element 60), the taps (e.g., outputs of the delay elements 60, 62) and an end of the delay line (e.g., an output of the delay element 64) are weighted by respective multipliers 66, 68, 70, and 72 having respective filter coefficients $b_0$, $b_1$, $b_2$, and $b_3$ and subsequently summed via respective adders 67, 69, 71 to form an output signal y on line 74. Furthermore, the taps (e.g., the outputs of the delay elements 60 and 62) and the end of the delay line (e.g., the output of the delay element 64) are weighted by the respective multipliers 76, 78, and 80 with filter coefficients $-a_1$, $-a_2$, and $-a_3$ and subsequently added together via the respective adders 77, 79, 81 with an input signal x on line 82 to form a signal supplied to the input of the delay line (e.g., the input of the delay element 60).

In general, the transfer function of the all pass filter 58 in FIG. 3 is, for example, a special case of the IIR filter 56 in FIG. 2. The transfer function H(z) of an 3rd order IIR filter 56 in FIG. 2 may be expressed as:

$$H(z) = y/x \quad \text{(Eq. 1)}$$
$$= (b_0 + b_1 \cdot z^{-1} + b_2 \cdot z^{-1} + b_3 \cdot z^{-1})/$$
$$(1 + a_1 \cdot z^{-1} + a_2 \cdot z^{-1} + a_3 \cdot z^{-1})$$

The all-pass function of such a filter is:
$c_0=1$, $c_1=a_1$, $c_2=a_2$, $c_3=a_3$.

The present invention is not limited, however, to the filter structure and order illustrated in FIGS. 2 and 3. For example, alternative structures may include a direct form I, a lattice, et cetera. The simplest all-pass filter is a unit-delay $H(z)= e^{j\phi\omega T}=e^{j\phi(2\pi f/fs)}$ where "f" represents a frequency in Hertz ("Hz") and T=1/fs represents a sampling period in seconds ("s").

Figure 4A:
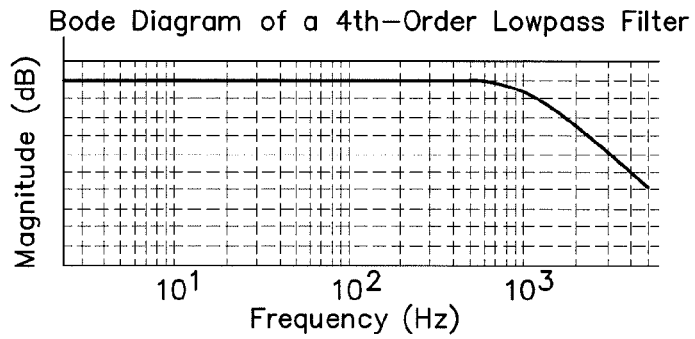
FIGS. 4A-4D are graphical illustrations of one embodiment of ideal frequency and phase characteristics of a low pass filter cascade of decimation and interpolation filters and a corresponding all-pass filter, which may be included in the sub-band signal processing apparatus in FIG. 1.
Figure 4B:
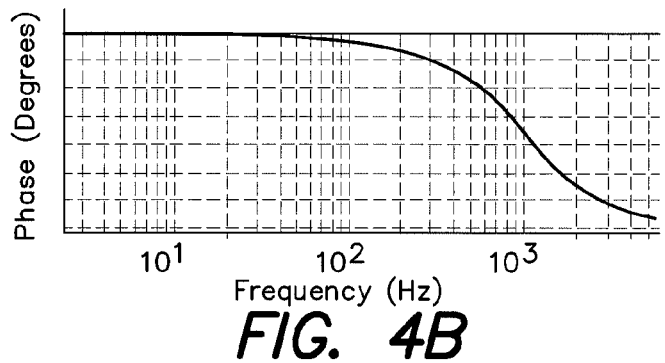
Figure 4C:
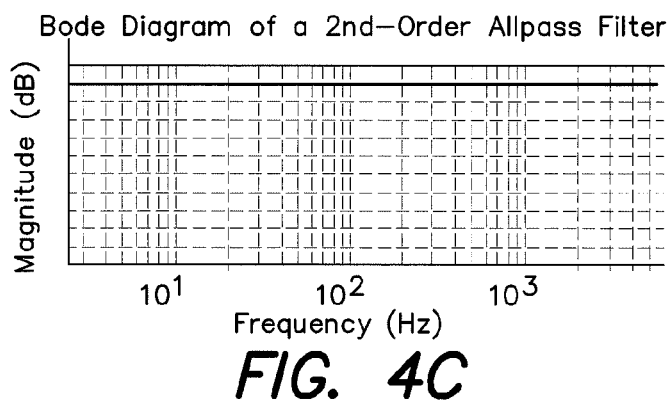
Figure 4D:
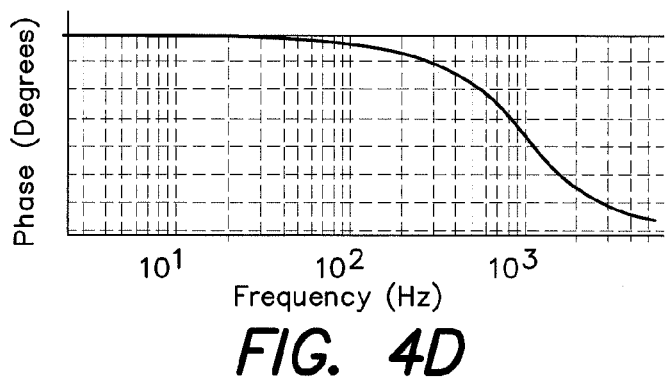

FIGS. 4A-4B graphically illustrate behavior of a fourth ("4th") order low-pass filter, while FIGS. 4C-4D illustrate the response of a corresponding 2nd order all-pass filter. The phase characteristics (e.g., phase over frequency) of both these filters are substantially identical. In contrast, amplitude in the 4th order low-pass filter decreases with increasing frequency while amplitude in the all-pass 2nd order filter is substantially constant over frequency.

The basis filter 30 included in the sub-band processing apparatus 10 can substantially change characteristics of the analysis filter bank 12. Using the low-pass filter $H_B(z)$, a splitting frequency can be shifted from $\pi/2$ to lower frequencies, and the aliasing components in the sub-bands can be avoided. Furthermore, a transition bandwidth between the low-pass and the high-pass sub-bands 18, 20, respectively, can be controlled by one filter, and the transition bandwidth can be made small while maintaining a constant computational efficiency.

Aliasing may not be completely cancelled where the low-pass and the high-pass sub-bands 18, 20 use different signal processing ("SP"). However, a suitable transfer function $H_B(z)$ of the basis filter 30 can solve this problem. The low-pass signal $X_0(z)$ in the sub-band processing apparatus 10 reads in terms of the input signal $X(z)$ as:

$$X_0(z)=\tfrac{1}{2}H_D(z^{1/2})\cdot X(z^{1/2})\cdot H_B(z)+\tfrac{1}{2}H_D(-z^{1/2})\cdot X(-z^{1/2})\cdot H_B(z) \quad (Eq.\ 2)$$

The interpolated signal is accordingly:

$$Y_0(z) = X_0(z^2)\cdot H_I(z) \quad (Eq.\ 3)$$
$$= \frac{1}{2}H_D(z)\cdot H_I(z)\cdot H_B(z^2)\cdot X(z) +$$
$$\frac{1}{2}H_D(-z)\cdot H_I(z)\cdot H_B(z^2)\cdot X(-z)$$

The high-pass sub-band signal $Y_1(z)$ on the line 24 is generated by subtracting the low-pass sub-band signal $Y_0(z)$ from the delayed and all-pass filtered input signal $z^{-\nu}\cdot X(z)$:

$$Y_1(z)=H_A(z)\cdot z^{-\nu}X(z)-Y_0(z) \quad (Eq.\ 4)$$

Assuming that the signal processors 44, 46 in the low-pass sub-band 18 and the high-pass sub-band 20 use pure scaling by factors $\alpha_{LP}$ and $\alpha_{HP}$, respectively, the two processed sub-band signals $\tilde{Y}_0(z)$ and $\tilde{Y}_1(z)$ in the synthesis filter banks 48 illustrated in FIGS. 1 and 2 may be expressed as:

$$\tilde{Y}_0(z)=\alpha_{LP}\cdot X_0(z^2)\cdot H_I(z)=\alpha_{LP}\cdot Y_0(z) \quad (Eq.\ 5)$$

$$\tilde{Y}_1(z)=\alpha_{HP}\cdot Y_1(z) \quad (Eq.\ 6)$$

and the output signal $Y(z)$ as a sum of the two signals is:

$$Y(z) = \tilde{Y}_0(z)+\tilde{Y}_1(z) \quad (Eq.\ 7)$$
$$= \alpha_{HP}\cdot x^{-\nu}\cdot X(z)+Y_0(z)\cdot(\alpha_{LP}-\alpha_{HP})$$

-continued
$$= X(z)\cdot\left[\begin{array}{c}\alpha_{HP}\cdot H_A(z)\cdot z^{-\nu}+(\alpha_{LP}-\alpha_{HP})\cdot\\ \frac{1}{2}H_D(z)\cdot H_I(z)\cdot H_B(z^2)\end{array}\right]+$$
$$X(-z)\cdot\left[(\alpha_{LP}-\alpha_{HP})\cdot\frac{1}{2}H_D(-z)\cdot H_I(z)\cdot H_B(z^2)\right].$$

The term starting with $X(-z)$ in Eq. 7 describes the remaining aliasing at the output of the filter bank. In a typical Laplacian pyramid type filter bank, where $H_B(z)=1$, aliasing is not cancelled in the presence of different scaling factors $\alpha_{LP}$ and $\alpha_{HP}$ in the sub-bands. This typically also applies to sub-band signal processing with finite quantization errors or with different frequency responses.

Figure 5:
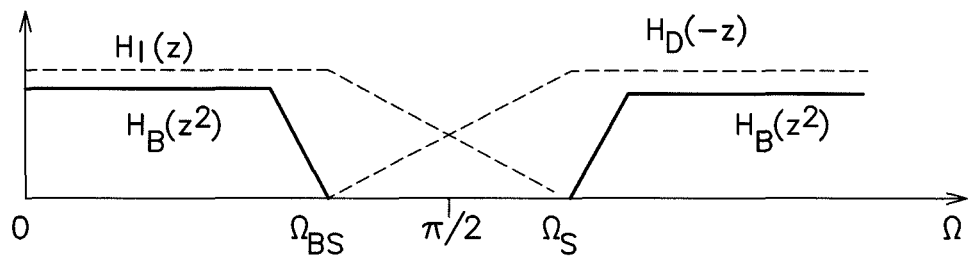
FIG. 5 is a graphical illustration of one embodiment of frequency characteristics of a frequency swapped decimation filter, a basis filter and an interpolation filter for substantially aliasing free sub-band signal processing.

FIG. 5 graphically illustrates one embodiment of frequency characteristics of a frequency swapped decimation filter having a transfer function $H_D(-z)$, a basis filter having a transfer function $H_B(z^2)$ and a second order interpolation filter having a transfer function $H_I(z)$ for substantially aliasing free sub-band signal processing. Assuming that the signals in the sub-bands 18, 20 (FIG. 1) are not altered by the signal processors 44, 46, aliasing is substantially cancelled in the synthesis filter bank 48. Such a cancelling effect is achieved using an additional filter: e.g., the basis filter 30 having the transfer function $H_B(z)$. Since $H_D(z)=H_I(z)$, both with a pass band cut-off frequency $\Omega_P$ and a stop band cut-off frequency $\Omega_S$, and the stop band cut-off frequency $\Omega_{B,S}$ of $H_B(z)$ is not greater than $\pi-\Omega_S$, $H_D(-z)\cdot H^1(z)\cdot H_B(z^2)$ is zero for $z=e^{j\Omega}$ frequencies $0\leq\Omega\leq\pi$. Accordingly, the aliasing terms in Eq. 2 and Eq. 3 are eliminated providing aliasing-free sub-band processing.

Figure 6:
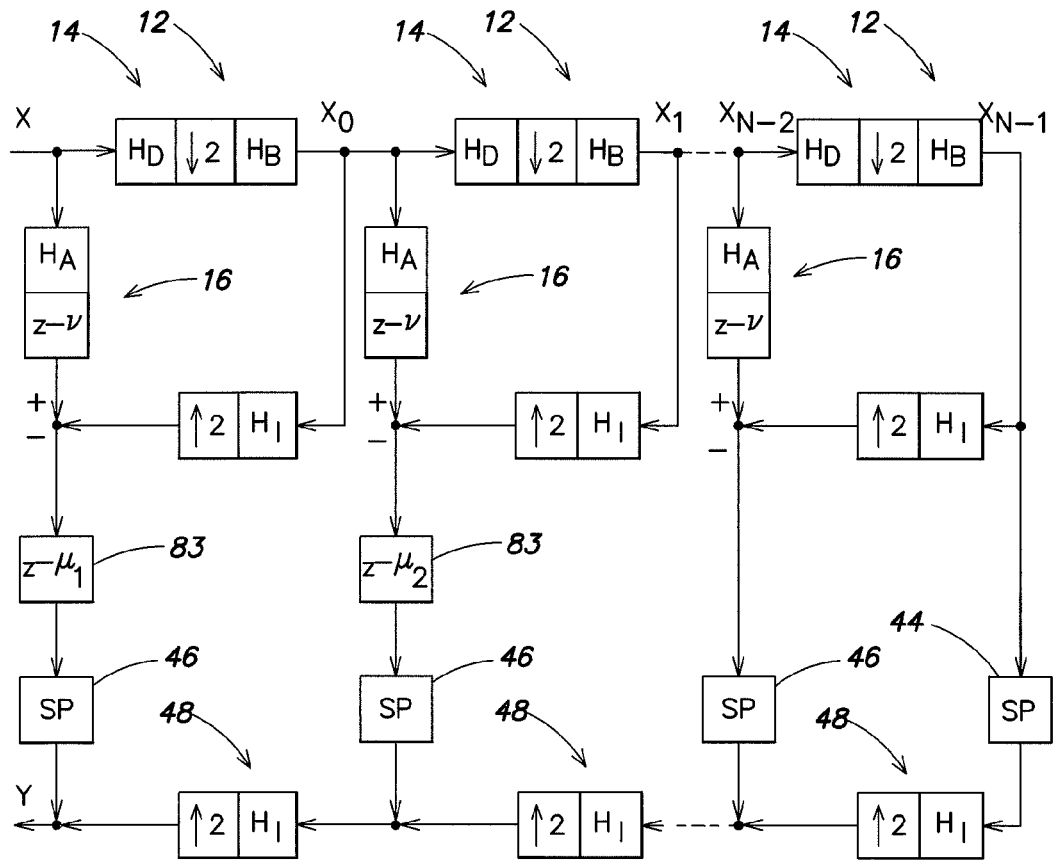
FIG. 6 illustrates one embodiment of a sub-band signal processing apparatus for processing a plurality of octave-spaced sub-bands.

Referring to FIG. 6, the two-band filter banks in FIG. 1 can be extended to an n-band filter bank (n>2) with octave band splitting via a continued splitting of respective low-pass sub-band into two sub-bands of equal bandwidth. In other words, n analysis filter banks 12, n sub-band signal processors 18 and n synthesis filter banks 48 are cascaded such that the first branch of at least one analysis filter bank includes the first and the second branches 14, 16 of a subsequent analysis filter bank 12 in the cascade. The low-pass output signal $X_0(z)$ of the first analysis filter bank is input to the next analysis filter bank, which is operated, for example, at half of the sampling rate of the first filter bank. The low-pass output signal $X_1(z)$ of the first analysis filter bank is fed into the next analysis filter band, etc. The high-pass sub-band signals and the low-pass signal of the last analysis filter bank are output in a synchronized manner by respective delays $z^{-\mu 1}$, $z^{-\mu 2}$, using a plurality of delay units 83, for sub-band signal processing and then reconstructed by interpolation sections to generate the output signal Y.

Figure 7:
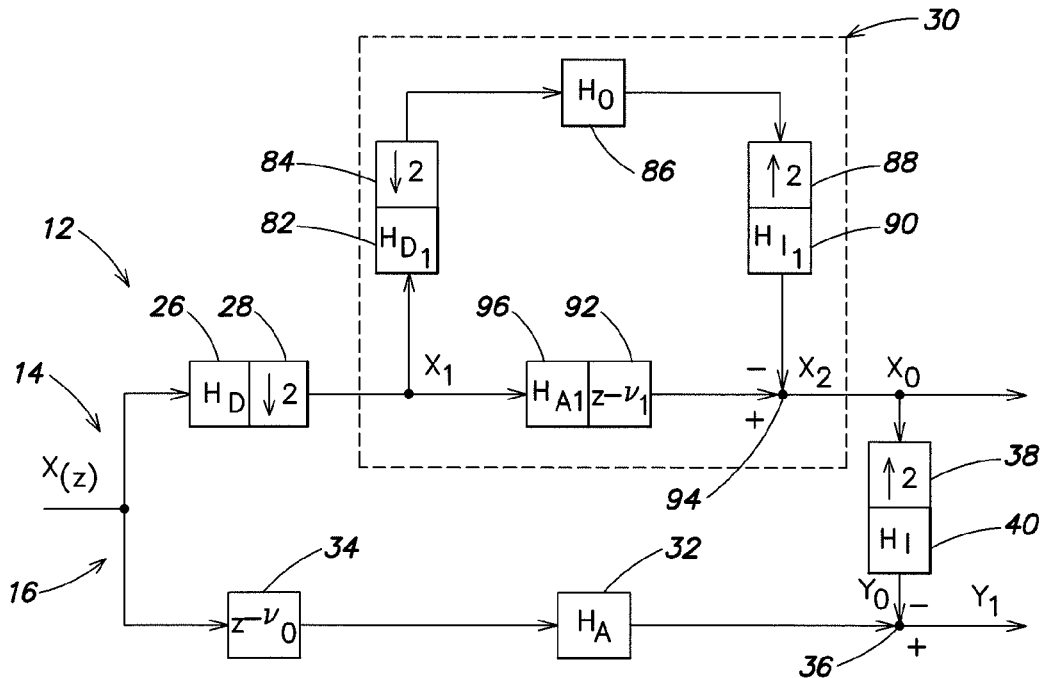
FIG. 7 illustrates one embodiment of a basis filter, which may be included in the sub-band signal processing apparatus in FIG. 1.

Referring to FIG. 7, the basis filter 30 having the transfer function $H_B(z)$ in FIG. 1 may also be implemented as a multi-rate complementary arrangement. The input signal $X_1(z)$ of such a basis filter is first down-sampled by a decimation high-pass filter 82, having a transfer function $H_{D1}(z)$ and a down-sampler 84, by, for example, a factor of 2. The down-sampled signal is filtered in a kernel filter 86 (e.g., a sub-base filter) having a transfer function $H_0(z)$ which is responsible for the transition slope between the pass band and the stop band of the basis filter 30. The output signal is then interpolated by a factor equal to the decimation (e.g., two) by an up-sampler 88 and an interpolation high-pass filter 90 having a transfer function $H_{I1}(z)$, to form a signal $X_2(z)$. The input signal $X_1(z)$ is further delayed by a delay element 92. The signal $X_2(z)$ is subtracted from the delayed signal $X_1(z)$ by a subtractor 94 to form the signal $X_0(z)$. Altogether, the low-pass filter $H_0(z)$ is mapped into a high-pass filter with double sampling frequency. The transition bandwidth with respect of the sampling frequency has been reduced by a factor of 2.

By subtracting the output signal $X_2(z)$ from the delayed input signal $z^{-\nu 1} \cdot X_1(z)$, the complementary low-pass filter $H_B(z)$ (i.e., the basis filter 30) is obtained. The cut-off frequency of the basis filter 30 is approximately between $\pi/2$ and $\pi$. The transition bandwidth of the basis filter 30 can be arbitrarily reduced by continued decimation, interpolation and complementary operation as described above. Due to the decreasing sample rates, the filter operations per unit time are limited and tend to be twice of the filter operations of the first decimation/interpolation section. Thus, the bandwidth can be kept small while the computational efficiency is substantially constant. On the other hand, the delays and the number of delay elements needed for the complementary operations increase with decreased transition bandwidth.

In the present embodiment, the decimation filter and the interpolation filter may be FIR filters. Instead of using a linear phase decimation filter and a linear phase interpolation filter, however, the basis filter 30 may be implemented as a multirate complementary arrangement as illustrated in FIG. 1. Accordingly, the FIR filters are replaced by the IIR low-pass filters 82 and 90 and a corresponding all-pass filter 96 having a transfer function $H_{A1}$ is cascaded to the delay element 92 that, for example, compensates for the delay (e.g., the phase response) of the linear phase sub-basis filter 86.

The sub-band processing apparatus can substantially reduce the delay and increase the computational efficiency in sub-band processing of audio systems (e.g., vehicle audio systems) by employing IIR minimum phase filters at least in the analysis filter bank 12. This is possible since human auditory systems are relatively insensitive to phase distortions in processed audio signals.

Although various exemplary embodiments of the invention have been disclosed, it will be apparent to those skilled in the art that various changes and modifications can be made which will achieve some or all of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. An apparatus for sub-band processing an input signal, comprising:
    an analysis filter bank including first and second signal branches for decomposing the input signal into two sub-band signals, the first signal branch including a decimation filter connected upstream of a down-sampling unit and a basis filter, and the second signal branch including an all-pass filter and a subtractor that is connected downstream of the all-pass filter and the basis filter in the first signal branch via a first up-sampling unit and a first interpolation filter;
    first and second sub-band signal processors which respectively receive the two sub-band signals from the analysis filter bank, and generate two processed sub-band signals; and
    a synthesis filter bank for synthesizing an output signal, the synthesis filter bank including an adder that receives the processed sub-band signal of the second branch and the processed sub-band signal of the first branch via a second up-sampling unit and a subsequent second interpolation filter;
    where at least one of the decimation filter and the first interpolation filter comprise an infinite impulse response filter; and
    where the all-pass filter has a phase response that compensates for a phase response of at least one of the decimation filter and the first interpolation filter and the basis filter comprises first and second signal branches supplied with a sub-basis filter input signal.

2. The apparatus of claim 1, where the basis filter comprises a finite impulse response filter.

3. The apparatus of claim 1, where the basis filter comprises a linear phase infinite impulse response filter.

4. The apparatus of claim 1, where the second signal branch includes a first delay unit that is connected in series with the all-pass filter and that has a phase response that compensates for a phase response of at least the basis filter.

5. The apparatus of claim 1, where the decimation filter, the first interpolation filter and the second interpolation filter have substantially the same transfer functions.

6. The apparatus of claim 1, where the decimation filter, the first interpolation filter and the second interpolation filter each comprise a low pass filter.

7. The apparatus of claim 1, where the decimation filter, the first interpolation filter and the second interpolation filter each comprise a minimum phase impulse response filter.

8. The apparatus of claim 1, where, in the analysis filter bank, the decimation filter is connected upstream of both the down-sampling unit and the all-pass filter.

9. The apparatus of claim 1, further comprising n analysis filter banks, n sub-band signal processors and n synthesis filter banks, where the respective analysis filter banks, sub-band signal processors and the synthesis filter banks are cascaded such that the first branch of at least one analysis filter bank includes the first and the second branches of a subsequent analysis filter bank in the cascade.

10. The apparatus of claim 1, where the basis filter comprises first and second signal branches supplied with a sub-basis filter input signal, which first signal branch of the basis filter includes a further decimation filter, a second down-sampling unit and a further basis filter, and which second branch of the basis filter includes a second delay unit and a second subtractor that provides a basis filter output signal, where the second subtractor is connected downstream of the second delay unit and is connected downstream of the basis filter via a third up-sampling unit and a subsequent third interpolation filter.

11. The apparatus of claim 10, where
    at least one of the second decimation filter and the third interpolation filter is an infinite impulse response filter;
    a second all-pass filter is connected in series to the second delay unit; and
    the second all-pass filter has a phase response that compensates for at least one of a phase response of the second decimation filter and a phase response of the third interpolation filter.

12. The apparatus of claim 11, where the second delay unit has a phase response that compensates for a phase response of at least the sub-basis filter.

13. The apparatus of claim 1, where the basis filter comprises a multi-rate complementary filter.

14. A method for sub-band processing of an input signal, comprising:

decomposing the input signal into two sub-band signals for establishing two sub-bands by
  decimation filtering, down-sampling and basis-filtering in a first signal branch; and
  all-pass filtering and subtracting an up-sampled and interpolation-filtered signal of the first signal branch from an all-pass filtered input signal in a second signal branch;
processing the two sub-band signals from the first and the second signal branches in the respective sub-bands to generate two processed sub-band signals; and
synthesizing an output signal by
  up-sampling and interpolating the processed sub-band signal of the first branch; and
  adding the processed sub-band signal of the second signal branch and the up-sampled and interpolated processed sub-band signal of the first signal branch;
where at least one of the decimation filtering and the first interpolation filtering has an infinite impulse response; and
where an all-pass filtering phase response compensates for a phase response of at least one of the decimation filtering and the first interpolation filtering.

15. The method of claim 14, where the step of basis-filtering comprises finite impulse response filtering.

16. The method of claim 14, where the step of basis-filtering comprises linear phase infinite impulse response filtering.

17. The method of claim 14, where the step of decimation-filtering and at least one of the steps of interpolation-filtering have substantially similar transfer functions.

18. The method of claim 14, where the step of decimation-filtering and at least one of the steps of interpolation filtering comprise low pass filtering.

19. The method of claim 14, where the step of decimation-filtering and at least one of the steps of interpolation filtering have a minimum phase impulse response.

20. The method of claim 14, where the step of decomposing further comprises delaying in the second signal branch the all-pass filtered second sub-band signal.

21. The method of claim 14, where the step of basis-filtering comprises multi-rate complementary filtering.

22. The method of claim 21, where the step of basis filtering further comprises: supplying a basis filter input signal to first and second filter signal branches; decimation filtering, down sampling and sub-basis filtering a signal in the first filter signal branch; delaying a signal in the second filter signal branch; and subtracting an up-sampled and subsequently interpolation-filtered signal from the first filter signal branch from the delayed signal from the second filter signal branch to provide a basis filter output signal.

23. The method of claim 22, where
  at least one of the second steps of decimation filtering and the third steps of interpolation filtering have an infinite impulse response;
  a second step of all-pass filtering is performed before or after the second step of signal delaying; and
  the second step of all-pass filtering has a phase response that compensates for a phase response of at least one of the second step of decimation filtering and the third step of interpolation filtering.

24. The method of claim 23, where the second step of delaying has a phase response that compensates for the phase response of at least the sub-basis filter.

25. An apparatus for sub-band processing an input audio signal, comprising:
  an analysis filter bank that receives the input audio signal and includes first and second parallel signal branches that respectively provide first and second sub-band signals, where the first signal branch includes a decimation filter connected upstream of a down-sampling unit and a basis filter, and the second signal branch includes an all-pass filter connected upstream of a subtractor that receives the first sub-band signal through a first up-sampling unit and a first interpolation filter;
  a processor that processes the first and the second sub-band signals to generate respective first and second processed sub-band signals; and
  a synthesis filter bank including an adder that receives the first processed sub-band signal through a second up-sampling unit and a second interpolation filter and the second processed sub-band signal, and provides an output signal;
  where at least one of the decimation filter and the first interpolation filter comprise an infinite impulse response filter; and
  where the all-pass filter has a phase response that compensates for a phase response from at least one of the decimation filter and the first interpolation filter.

26. The apparatus of claim 25, wherein the processor includes first and second processors that respectively receive the first and the second analyzed sub-band signals, and generate the first and the second processed sub-band signals.

27. A method for sub-band processing an input audio signal in a vehicle, comprising:
  decomposing the input audio signal into first and second sub-band signals by
    decimating and basis-filtering a first signal in a first signal branch to provide the first sub-band signal;
    up-sampling and interpolating the first sub-band signal;
    all-pass filtering a second signal in a second signal branch; and
    subtracting the up-sampled and interpolated first sub-band signal from the all-pass filtered second signals to provide a second sub-band signal;
  generating first and second processed sub-band signals from the first and the second sub-band signals via one or more processors; and
  synthesizing the first and the second processed sub-band signals in a synthesis filter bank by up-sampling and interpolating the first processed sub-band signal, and adding the up-sampled and interpolated first processed sub-band signal to the second processed sub-band signal to provide an output signal;
  where at least one of the step of decimation filtering and the first step of interpolation filtering has an infinite impulse response; and
  where an all-pass filtering phase response compensates for a phase response of at least one of the step of decimation filtering and the first step of interpolation filtering.

* * * * *